United States Patent [19]

Rapp et al.

[11] 4,173,495
[45] Nov. 6, 1979

[54] SOLAR COLLECTOR STRUCTURES CONTAINING THIN FILM POLYSILOXANE, AND SOLAR CELLS

[75] Inventors: Charles F. Rapp; Norman L. Boling, both of Toledo, Ohio

[73] Assignee: Owens-Illinois, Inc., Toledo, Ohio

[21] Appl. No.: 902,520

[22] Filed: May 3, 1978

[51] Int. Cl.² .......................................... H01L 31/04
[52] U.S. Cl. ....................... 136/89 PC; 136/89 HY; 250/227; 250/361 R; 250/367; 250/458; 250/483; 250/486; 252/301.35; 350/96.10
[58] Field of Search ........ 136/89 PC, 89 HY, 89 CC; 126/270, 271; 350/96.10; 250/227, 361 R, 367, 458, 483, 486, 488; 428/913; 252/301.35, 301.36

[56] References Cited

U.S. PATENT DOCUMENTS

| 3,309,226 | 3/1967 | Weisbeck et al. ..................... 117/201 |
| 3,351,516 | 11/1967 | Weisbeck et al. ................. 161/18 X |
| 3,426,212 | 2/1969 | Klaas ..................................... 250/226 |
| 3,591,420 | 7/1971 | Streed ..................................... 136/89 |
| 3,714,119 | 1/1973 | Marks et al. ..................... 260/46.5 E |
| 3,912,931 | 10/1975 | Gravisse et al. ..................... 250/458 |
| 4,088,508 | 5/1978 | Gravisse ......................... 136/89 H X |

OTHER PUBLICATIONS

J. A. Levitt et al., "Materials for Luminescent Greenhouse Solar Collectors", *Applied Optics,* Optics, vol. 16, pp. 2684-2689 (1977).

*Primary Examiner*—Aaron Weisstuch
*Attorney, Agent, or Firm*—Charles S. Lynch; M. E. Click; D. H. Wilson

[57] ABSTRACT

Disclosed is a composite collector and concentrator structure comprising a laminate having a self-supporting layer of solid light transmitting material of extended area in one plane in optical contact with a relatively thin layer of a silicone resin derived from a trifunctional silane containing at least one species of luminescent material which absorbs electromagnetic radiation and emits electromagnetic radiation of a longer wave length. Use with photovoltaic solar cells is also disclosed.

12 Claims, 6 Drawing Figures

SOLAR COLLECTOR STRUCTURES CONTAINING THIN FILM POLYSILOXANE, AND SOLAR CELLS

This invention in an important aspect concerns the art of exposing semiconductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector and concentrator of radiation to be impinged on a semiconductor photocell. For instance, Weber and Lambe in Applied Optics, Vol. 15, pages 2299–2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell but is concentrated since the light received by the large area of the collector escapes only in the small area where the photocell is optically connected to the collector.

Another article, by Levitt and Weber, appears in Applied Optics, Vol. 16, No. 10, pages 2684–2689, October 1977, should be read with the article first mentioned.

Other publications aiding in the understanding of the setting of the present invention include Goetzberger, Applied Physics, 14, 123–139, 1977, German patent application 2620115, published Nov. 10, 1977 (not published before our conception, however) and, referred to in the latter patent application, German patent application 2554226, published June 8, 1977, which is of some peripheral interest.

Also, numerous patents deal with the conversion of solar energy to different wave lengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

In the recent prior art structure of the type disclosed in the aforesaid Weber and Lambe publication, which describes what is there termed a "luminescent greenhouse collector", the luminescent medium or layer for practical reasons needs to be self-supporting. Therefore, the luminescent layer obviously must be at least one-half millimeter thick if it is as small as, say, 10 centimeters on a side, or it must be much thicker if it is, say, a meter on a side.

Related U.S. application, Ser. No. 902,521, filed by one of us of even date herewith discloses a composite collector and concentrator structure comprising a laminate having a self-supporting layer of solid light transmitting material of extended area in one plane in optical contact with a relatively thin layer of host material containing at least one species of luminescent material which absorbs electromagnetic radiation and emits electromagnetic radiation of a longer wave length. Use with photovoltaic solar cells is also disclosed.

It is an object of the present invention to provide a luminescent collector-concentrator of solar energy of increased efficiency wherein a superior host resin is employed as a thin film.

It is a further object of the invention to provide such a luminescent solar collector-concentrator optically coupled at a small fraction of its surface to a semiconductor photovoltaic cell.

Other objects, as well as aspects and advantages, of the invention will become apparent from the present specification, of the drawings and the claims.

In the structure of the present invention, a very thin, or at least a relatively very thin luminescent doped silicone resin layer is supported in good optical contact on a radiation conducting support layer ("in optical contact" meaning that there is minimum reflection at the interface of the support layer and the luminescent layer), where the support layer is thick enough for its area to be self-supporting. Thus, the support layer is generally at least one-half millimeter thick, usually thicker, and has a thickness ratio to the thin luminescent layer of more than 4:1 and usually very much higher. It is usually preferable that the refractive index of the luminescent layer be essentially the same as or somewhat less than the refractive index of the support layer, in order to minimize reflection at the interface, although for reasons to be discussed later the reverse situation might be tolerated in certain instances.

Thus, according to the present invention there is provided a luminescent solar collector and concentrator comprising a radiation collection medium for receiving incident solar radiation, said medium containing at least one luminescent species capable of emitting luminescent radiation upon excitation with incident solar radiation, said medium being totally internally reflective of a major portion of said emitted luminescent radiation, wherein said radiation collection medium is a composite structure comprising a thin layer of a thermoset polysiloxane of a trifunctional silane containing dispersed therein at least one luminescent species selected from the group consisting of fluorescent organic dyes, fluorescent metallo-organic chelates and finely divided inorganic phosphors, said layer being optically coupled to a thick radiation conducting layer of at least 0.5 mm thickness which thick layer (1) is totally internally reflective of a major portion of said emitted luminescent radiation, (2) has an index of refraction close to that of said thin layer and (3) has a thickness ratio to said thin luminescent layer of higher than 4:1. Such collector in an important embodiment is optically coupled to a semiconductor photocell.

Such polysiloxane resins can be derived, for instance, by hydrolysis and condensation of silanes of the formula

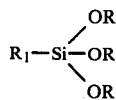

where R is a lower alkyl radical containing 1-4 carbon atoms, usually methyl or ethyl, and $R_1$ is an alkyl radical containing 1-6 carbon atoms, an alkenyl radical containing 2-6 carbon atoms or is an aryl radical such as phenyl. Mixed condensation products of silanes of the above formula also form suitable polysiloxanes. For further details relative to such polysiloxanes see, for instance, U.S. Pat. Nos. 3,395,117; 3,388,114 and 3,389,121.

The thermoset polysiloxanes, even though they are relatively expensive, can be economically used as the thin host film or films in the foregoing structure since only a small amount of the resin is required. There are several advantages to such polysiloxanes.

1. They are compatible with most dyes and metallo-organic chelates as well as finely divided inorganic solid phosphors. 2. It has been found that they seal extremely well to glass and most plastics useful as the thick film, such as poly(methyl methacrylate) and they moreover seal to the semi-conductor photocell, such as a silicon cell. 3. The index of refraction value of such resins is from about 1.45 to about 1.55, ideal for optical coupling to most glasses and acrylic plastics used for the thick film and for the usual antireflective coating carried on the silicon photocell. 4. They have excellent weathering characteristics, i.e., they are not subject to weathering, i.e., they withstand chemical attack from the atmosphere including water and the usual air pollutants. 5. They are extremely abrasion resistant. 6. They are very resistant to solar ultraviolet light degradation. 7. Very importantly, they can be cured to the thermoset condition at a low enough temperature to avoid harm to even the most heat sensitive of the luminescent organic species, such as dyes and chelates.

Of course, by the term thermoset polysiloxane of a trifunctional silane it is meant to include polymers derived from trifunctional silanes containing some difunctional or even monofunctional silanes, so long as such polymers are sufficiently cross-linked to be thermoset. Very suitable thermosetting silicone resins are described in U.S. Pat No. 3,395,117, the disclosure of which is incorported herein by reference.

In the drawings, FIG. 1 is a hypothetical representation of the absorption and emission bands of a given luminescent species of a given concentration in the luminescent polysiloxane hos layer.

Figure 1:
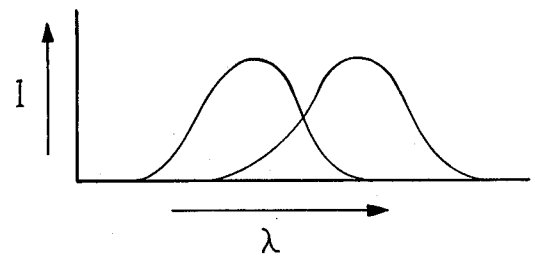
Figure 2:
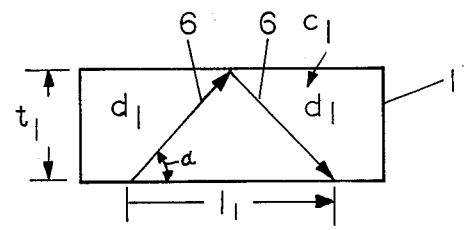
FIG. 2 depicts schematically a side view of a single thick layer containing throughout a luminescing species.
Figure 3:
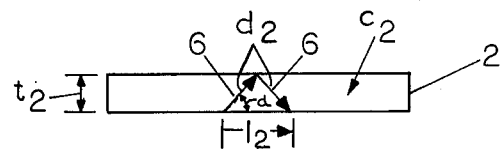
FIG. 3 depicts a thinner layer containing throughout the same luminescing species at a higher concentration.
Figure 4:
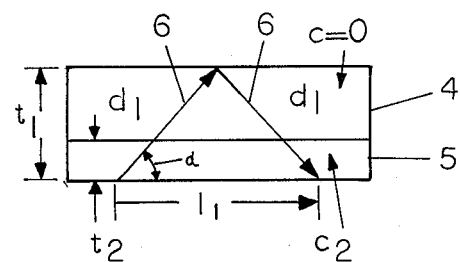
FIG. 4 depicts a composite layer of the invention wherein the luminescing species in the bottom polysiloxane layer has the same concentration as in FIG. 3 and wherein the top layer is the support layer.

The structure of the invention can be understood more clearly by examination of these drawings. Many luminescing materials such as fluorescent organic dyes have some overlap between their absorption and emission bands, as is shown in FIG. 1. In the type of collector or concentrator of the present structure, much of the energy emitted in the region of overlap can be reabsorbed and lost, as will be understood by those skilled in the art. This effect becomes more severe as the concentration of the dye is increased. For one thing, the wavelength area of overlap in the absorption and emission spectra as in FIG. 1 would be much greater. Furthermore, since the dye concentration is increased in a thinner film to maintain the same absorption, loss by reabsorption would increase for this reason alone. Thus, referring to FIGS. 2, 3 and 4, 1 is a thick self-supporting luminescent material of thickness $t_1$ comprising a solid host containing a luminescent species in concentration $c_1$; 2 is a much thinner luminescent material of thickness $t_2$ comprising the same host containing the same luminescent species in higher concentration $c_2$. In FIG. 4 the polysiloxane luminescent layer 5 identical to 2 of FIG. 3 is in optical contact with and supported by thicker, self-supporting material 4 of high optical quality which in this instance contains no luminescent species. The numeral 6 in each figure represents a single ray in each figure being totally internally reflected through distance $d_1$ or $d_2$, at a given angle $\alpha$. In order for the above plates to have the same absorption efficiency for the incident solar light, it must be true that $c_1 t_1 = c_2 t_2$ where $c_1$ and $c_2$ are the dye concentrations in the plates 1, 2 and 5. Also, since $t_1/t_2 = d_1/d_2$, it can easily be seen that the same reabsorption loss will occur in the total internally reflected luminescence when traveling distances $1_1$, $1_2$ and $1_1$ transversely across the plates of FIGS. 2, 3 and 4 respectively. Therefore, it can be seen from the above that the same low reabsorption can be accomplished from a very thin layer of the host material doped at high concentration, supported on a thick clear plate as can be accomplished from the thick plate at a lower concentration. Of course, in FIG. 4 there is depicted the idealized situation in which the index of refraction of material 4 is the same as that of layer 5. If the index is somewhat different in the two materials, it will be understood that there will be some change in the angle when the ray in FIG. 4 enters 4 or 5 as the case may be, and thus the distance $1_1$ in FIG. 4 will vary somewhat from $1_1$ in FIG. 2, but the principle and advantages of the invention structure still obtain. Moreover, the refractive index, n, of the thin layer should ideally be equal to or less than n of the thick layer, but the reverse is possible if a particular combination of the substrate layer and the thin layer with its luminescent species is particularly advantageous in quantum efficiency of light conversion and thus makes it worthwhile to suffer some light loss by reason of the disadvantageous relationship of the indices.

Figure 5:
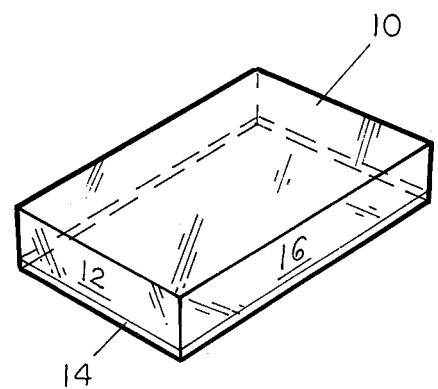
FIG. 5 shows a luminescent solar collector of the invention.
Figure 6:
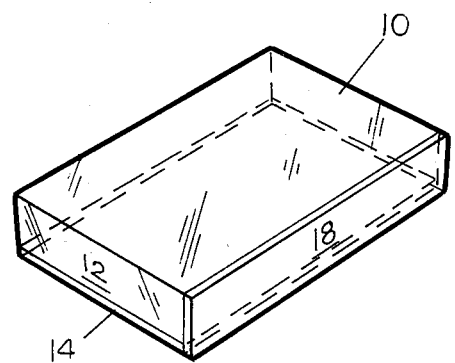
FIG. 6 is similar to FIG. 5 but shows a solar cell coupled to the collector.

FIG. 5 shows a luminescent solar collector of the present structure. FIG. 6 shows a luminescent solar collector with a semiconductor silicon solar photovoltaic cell covering one edge thereof. Electrical leads are connected to the silicon cell but are shown. Like parts have the same reference numbers in FIGS. 5 and 6.

In FIG. 5 collector 10 comprises thick, self-supporting layer 12 of material capable of conducting electromagnetic radiation and thin layer 14 of the defined polysiloxane host material containing at least one luminescent species as defined, capable of absorbing incident solar light and emitting electromagnetic radiation in another wavelength, usually a longer wavelength. Three edges of the collector are silvered or otherwise coated to reflect light while edge 16 is not. In operation, light from the sun hitting either face of extended area is absorbed in layer 14 and excites the luminescent species which emits radiation of desired wavelengths, as before described with respect to FIG. 4.

A large portion of the emitted radiation reflects back and forth by the process of total internal reflection, and reflection from the mirrored edges, until the concentrated light reaches the window of edge 16 where it escapes and is put to use as for instance in FIG. 6.

In FIG. 6, identical to FIG. 5, except that the edge (which is numbered 16 in FIG. 5) has semiconductor photovoltaic cell 18, such as a silicon cell having a P-N junction, optically coupled thereto. This can be accomplished for instance by placing an anti-reflective coating on the facing surface of the silicon cell and interposing an oil film of intermediate refractive index (usually about 1.5) between the silicon cell and the edge of the luminescent solar collector or concentrator.

While in connection with the description of FIGS. 5 and 6, it is explained that three edges have a reflective coating, in its broadest aspect the edges need not be coated with a reflective coating. The concentrator works perfectly without such coating, but of course the concentrated light will be emitted through all unmirrored edges. As will be noted hereafter, it is possible and in some cases definitely contemplated that the thick supporting layer of our structure such as in FIGS. 4, 5 and 6 will have a luminescent species, but it will be understood from the explanation of the basic advantage of our structure as explained in connection with FIGS. 1-4, that (1) the thick support layer 1 is mainly a radiation conducting layer, particularly for radiant energy emitted from the luminescent species in the thin luminescent layer and (2) in its usually preferred embodiment is less absorptive of said radiant energy than said thin layer, but not always. For instance, thick layer 12 of FIGS. 5 and 6 can contain luminescent species A that absorbs and is activated by wavelengths emitted by luminescent species B in thin layer 14, species A then emitting even longer wavelengths.

In the present structure the thin luminescent layer preferably has a thickness of no more than 0.25 mm, whether or not it contains more than one luminescent species either in one layer or in a composite layer made up of two thinner layers, each containing at least one luminescent species not in the other layer.

While the thick or supporting layer 12 can still be the fairly inexpensive acrylic resin of high quality as in most present day solar cell luminescent collectors, it is a distinct advantage that the support layer can be glass with its high optical quality, extremely low cost and low absorption characteristics. Moreover heat sensitive organic luminescent materials (dyes and chelates) can be used in the collector, but in the thin layer comprising the polysiloxane.

The possibility of using glass (sealed to the polysiloxane) as the thick support layer allows the glass layer to be doped if desired with an ion such as the uranyl ion or $Mn^{II}$ that absorb in low wavelengths and emit in visible wavelengths that are efficiently absorbed by a suitable dye or chelate that is the luminescent species in the underlying polysiloxane. Or $Ce^{III}$ can be incorporated in the glass, since it absorbs in the UV and thus protects the organic luminescent material in the polysiloxane layer from degradation by UV. Moreover, the $Ce^{III}$ is luminescent and emits in the visible spectrum and is thus converted to light that can be used to excite the organic luminescent dye or chelate species in the thin polysiloxane layer.

When two or more soluble luminescent species, such as dyes, are used in the thin polysiloxane layer in the manner disclosed in the Swartz et al. paper in Optics Letters, Vol. 1, No. 2, Aug. 1977, pp. 73-75, they can be used at a high enough concentration that radiationless (intermolecular) transfer of energy from one luminescent species to the next results. Such radiationless transfer is much more energy efficient. See Th. Forster, Discus. Faraday Soc. 27, 7(1959).

Thus, in one advantageous embodiment of the invention, the thick support layer is glass and the thin layer is a thermoset polysiloxane containing a luminescent material. In another, related embodiment, the glass layer contains a UV absorber luminescent material that emits in the visible spectrum.

As stated, the luminescent materials used in the present polysiloxane layer are fluorescent chelates, fluorescent dyes and finely divided solid phosphors.

In the following examples the luminescent dye was uniformly mixed with a 50 volume percent solution in butyl alcohol of partially cured but further curable polysiloxane resin, prepared as described in Example 1 of U.S. Pat. No. 3,395,117 (incorporated herein by reference). The coatings on the substrate, in each case clear poly(methyl methacrylate) squares ⅛ inch thick and four inches on a side, were made to achieve a final cured thickness of doped polysiloxane film of about 0.5 mil and of the concentration noted in the respective examples. The solutions were applied to one face of the clean poly(methyl methacrylate) plates and allowed to drain off. The final curing was effected in a drying oven held at 60° C. for two days.

Table 1 shows the three test plates, the luminescent species used and its concentration in the thin polysiloxane film coating.

TABLE 1

| Example | Luminescent Species | Concentration, Weight Percent |
| --- | --- | --- |
| 1 (control) | None | — |
| 2 | Rhodamine B | 0.15 |
| 3 | Coumarin 1 | 0.4 |

In the tests of the solar concentrators, plus the control, a silicon semiconductor cell having a P-N junction was used. The plates were polished on only one edge and the other edges had no reflective coating. A flat surface of the silicon cell was optically coupled to part of the polished edge. That surface of the cell carried the usual antireflective oxide coating and an index oil of $n_D$ of 1.457 was interposed between the cell and the edge of the luminescent solar concentrator. The silicon cell covered only 8.5 cm. of the length of the edge of the luminescent solar concentrator plate in each instance. The same cell was used in each example so that the results are comparable. The cell was connected through electrical leads to test instruments by which the short circuit current was measured with the sun on a bright day shining on the acrylic surface of the concentrator. The solar cell was shielded from the sun's direct rays. The results in milliamperes is shown in Table 2, together with the brightness of the sunlight as measured by a lightmeter.

TABLE 2

| Example | Illumination (BTU/hr/ft$_2$) | Short Circuit Current (milliamps) |
|---|---|---|
| 1 | 300 | 17.7 |
| 2 | 250 | 51.9 |
| 3 | 300 | 23.1 |

As will be evident to those skilled in the art, various modifications of this invention can be made or followed in the light of the foregoing disclosure and discussion without departing from the spirit and scope of the disclosure or from the scope of the claims.

We claim:

1. A luminescent solar collector and concentrator comprising a radiation collection medium for receiving incident solar radiation, said medium containing at least one luminescent species capable of emitting luminescent radiation upon excitation with incident solar radiation, said medium being totally internally reflective of a major portion of said emitted luminescent radiation, wherein said radiation collection medium is a composite structure comprising a thin layer of a thermoset polysiloxane of a trifunctional silane containing dispersed therein at least one luminescent species, said layer being optically coupled to a thick radiation conducting layer of at least 0.5 mm thickness, which thick layer (1) is totally internally reflective of a major portion of said emitted luminescent radiation, (2) has an index of refraction close to that of said thin layer, (3) is less absorptive of said emitted luminescent radiation than said thin layer and (4) has a thickness ratio to said thin layer of higher than 4:1.

2. A collector and concentrator of claim 1 wherein said thick layer also contains a luminescent species.

3. A collector and concentrator of claim 1 wherein said thin layer contains at least two luminescent species, the first of which has an emission spectrum overlapping the absorption spectrum of the other, said two luminescent species having a concentration sufficiently high that the major mode of activation of said other species by said first species is radiationless.

4. A collector and concentrator of claim 1 wherein said thick layer is a glass.

5. A collector and concentrator of claim 4 wherein said glass contains a luminescent species which absorbs ultraviolet light and emits light of a longer wave length.

6. A luminescent solar collector and concentrator comprising a radiation collection medium for receiving incident solar radiation, said medium containing at least one luminescent species capable of emitting luminescent radiation upon excitation with incident solar radiation, said medium being totally internally reflective of a major portion of said emitted luminescent radiation, a relatively small surface area of said medium being optically coupled to a photovoltaic solar cell responsive to said emitted luminescent radiation, wherein said radiation collection medium is a composite structure comprising a thin layer of a thermoset polysiloxane of a trifunctional silane containing dispersed therein at least one luminescent species, said layer being optically coupled to a thick radiation conducting layer of at least 0.5 mm thickness, which thick layer (1) is totally internally reflective of a major portion of said emitted luminescent radiation, (2) has an index of refraction close to that of said thin layer, (3) is less absorptive of said emitted luminescent radiation than said thin layer and (4) has a thickness ratio to said thin layer of higher than 4:1.

7. A collector and concentrator of claim 6 wherein said thick layer also contains a luminescent species.

8. A collector and concentrator of claim 6 wherein said thin layer contains at least two luminescent species, the first of which has an emission spectrum overlapping the absorption spectrum of the other, said two luminescent species having a concentration sufficiently high that the major mode of activation of said other species by said first species is radiationless.

9. A collector and concentrator of claim 6 wherein said thick layer is a glass.

10. A collector and concentrator of claim 9 wherein said glass contains a luminescent species which absorbs ultraviolet light and emits light of a longer wave length.

11. A luminescent solar collector and concentrator comprising a radiation collection medium for receiving incident solar radiation, said medium containing at least one luminescent species capable of emitting luminescent radiation upon excitation with incident solar radiation, said medium being totally internally reflective of a major portion of said emitted luminescent radiation, wherein said radiation collection medium is a composite structure comprising a thin layer of a thermoset polysiloxane of a trifunctional silane containing dispersed therein at least one luminescent species, said layer being optically coupled to a thick radiation conducting layer of at least 0.5 mm thickness, which thick layer (1) is totally internally reflective of a major portion of said emitted luminescent radiation, (2) has an index of refraction close to that of said thin layer and (3) has a thickness ratio to said thin layer of higher than 4:1.

12. A luminescent solar collector and concentrator comprising a radiation collection medium for receiving incident solar radiation, said medium containing at least one luminescent species capable of emitting luminescent radiation upon excitation with incident solar radiation, said medium being totally internally reflective of a major portion of said emitted luminescent radiation, a relatively small surface area of said medium being optically coupled to a photovoltaic solar cell responsive to said emitted luminescent radiation, wherein said radiation collection medium is a composite structure comprising a thin layer of a thermoset polysiloxane of a trifunctional silane containing dispersed therein at least one luminescent species, said layer being optically coupled to a thick radiation conducting layer of at least 0.5 mm thickness, which thick layer (1) is totally internally reflective of a major portion of said emitted luminescent radiation, (2) has an index of refraction close to that of said thin layer and (3) has a thickness ratio to said thin layer of higher than 4:1.

* * * * *

UNITED STATES PATENT AND TRADEMARK OFFICE
CERTIFICATE OF CORRECTION

PATENT NO. : 4,173,495
DATED : November 6, 1979
INVENTOR(S) : Charles F. Rapp, Norman L. Boling It is certified that error appears in the above-identified patent and that said Letters Patent are hereby corrected as shown below:

Column 5, line 1, after "are" insert --not--.

Signed and Sealed this

Eighth Day of July 1980

[SEAL]

Attest:

SIDNEY A. DIAMOND

Attesting Officer

Commissioner of Patents and Trademarks